US008806403B1

(12) United States Patent
Denisenko et al.

(10) Patent No.: US 8,806,403 B1
(45) Date of Patent: Aug. 12, 2014

(54) EFFICIENT CONFIGURATION OF AN INTEGRATED CIRCUIT DEVICE USING HIGH-LEVEL LANGUAGE

(71) Applicant: Altera Corporation, San Jose, CA (US)

(72) Inventors: Dmitry N. Denisenko, Toronto (CA); Deshanand Singh, Mississauga (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/923,975

(22) Filed: Jun. 21, 2013

(51) Int. Cl.
*G06F 17/50* (2006.01)

(52) U.S. Cl.
CPC .................................. *G06F 17/5054* (2013.01)
USPC ........................................................ 716/116

(58) Field of Classification Search
USPC .................................................. 716/100, 116
See application file for complete search history.

(56) References Cited

U.S. PATENT DOCUMENTS

| | | | | |
|---|---|---|---|---|
| 5,963,740 | A * | 10/1999 | Srivastava et al. | 717/130 |
| 6,964,029 | B2 * | 11/2005 | Poznanovic et al. | 716/105 |
| 6,983,456 | B2 * | 1/2006 | Poznanovic et al. | 717/133 |
| 7,155,708 | B2 * | 12/2006 | Hammes et al. | 717/155 |
| 7,299,458 | B2 * | 11/2007 | Hammes | 717/133 |
| 7,703,085 | B2 * | 4/2010 | Poznanovic et al. | 717/140 |
| 7,769,569 | B2 * | 8/2010 | Stern | 703/2 |
| 2003/0188299 | A1 * | 10/2003 | Broughton et al. | 717/141 |
| 2003/0233641 | A1 * | 12/2003 | Hank | 717/156 |
| 2003/0233642 | A1 * | 12/2003 | Hank | 717/156 |
| 2004/0088666 | A1 * | 5/2004 | Poznanovic et al. | 716/7 |
| 2004/0088685 | A1 * | 5/2004 | Poznanovic et al. | 717/140 |
| 2004/0088689 | A1 * | 5/2004 | Hammes | 717/154 |
| 2004/0088691 | A1 * | 5/2004 | Hammes et al. | 717/158 |
| 2006/0004996 | A1 * | 1/2006 | Gonion | 712/241 |
| 2006/0041872 | A1 * | 2/2006 | Poznanovic et al. | 717/140 |
| 2008/0015838 | A1 * | 1/2008 | Stern | 703/15 |
| 2009/0287908 | A1 * | 11/2009 | Rangan et al. | 712/206 |
| 2009/0288063 | A1 * | 11/2009 | Rangan et al. | 717/106 |
| 2010/0251196 | A1 * | 9/2010 | Stern | 716/5 |
| 2013/0125097 | A1 * | 5/2013 | Ebcioglu et al. | 717/136 |

OTHER PUBLICATIONS

August, D.I., "The Program Decison Logic Approach to Predicated Execution," *Proceedings of the 26th International Symposium on Computer Architecture*, pp. 208-219 (May 1999).
"Binary decision diagram", Wikipedia, retrieved from http://en.wikipedia.org/wiki/Binary_decision_diagram, pp. 1-5 (May 24, 2013).

* cited by examiner

*Primary Examiner* — Suchin Parihar
(74) *Attorney, Agent, or Firm* — Ropes & Gray LLP; Jeffrey H. Ingerman

(57) ABSTRACT

A method of programming or configuring an integrated circuit device using a high-level language includes parsing a logic flow to be embodied in the integrated circuit device to identify branching control flow, converting the branching control flow into predicated instructions, incorporating the predicated instructions into a high-level language representation of a configuration of resources of the integrated circuit device, and compiling the high-level language representation to configure said integrated circuit device. The high-level language representation can be executed to generate a configuration bitstream for the programmable integrated circuit device, or can be run on a processor on the programmable integrated circuit device to instantiate the configuration.

20 Claims, 6 Drawing Sheets

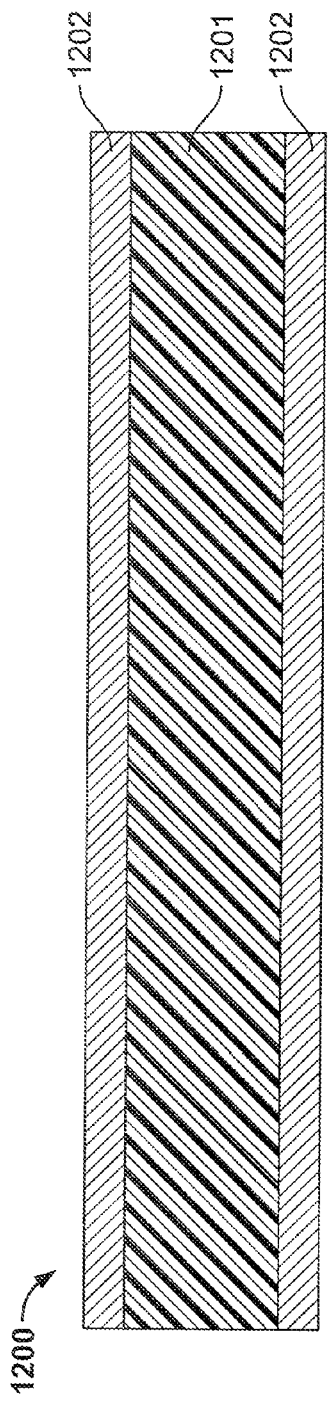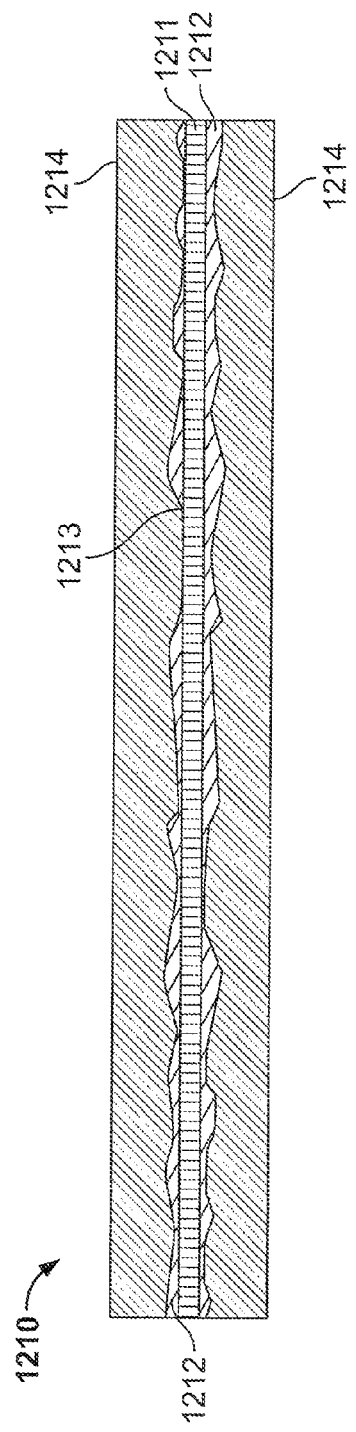

EFFICIENT CONFIGURATION OF AN INTEGRATED CIRCUIT DEVICE USING HIGH-LEVEL LANGUAGE

FIELD OF THE INVENTION

This invention relates to the use of a high-level language to specify the circuitry of an integrated circuit device, and particularly to configure a programmable integrated circuit device such as a field-programmable gate array (FPGA) or other type of programmable logic devices (PLD).

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

At some point, such devices began to be provided with embedded blocks of random access memory that could be configured by the user to act as random access memory, read-only memory, or logic (such as P-TERM logic). Moreover, as programmable devices have become larger, it has become more common to add dedicated circuits on the programmable devices for various commonly-used functions. Such dedicated circuits could include phase-locked loops or delay-locked loops for clock generation, as well as various circuits for various mathematical operations such as addition or multiplication. This spares users from having to create equivalent circuits by configuring the available general-purpose programmable logic.

While it may have been possible to configure the earliest programmable logic devices manually, simply by determining mentally where various elements should be laid out, it was common even in connection with such earlier devices to provide programming software that allowed a user to lay out logic as desired and then translate that logic into a configuration for the programmable device. With current larger devices, including those with the aforementioned dedicated circuitry, it would be impractical to attempt to lay out the logic without such software. Such software also now commonly includes pre-defined functions, commonly referred to as "cores," for configuring certain commonly-used structures, and particularly for configuring circuits for mathematical operations incorporating the aforementioned dedicated circuits. For example, cores may be provided for various trigonometric or algebraic functions.

Although available programming software allows users to implement almost any desired logic design within the capabilities of the device being programmed, most such software requires knowledge of hardware description languages such as VHDL or Verilog. However, many potential users of programmable devices are not well-versed in hardware description languages and may prefer to program devices using a higher-level programming language. But if the underlying logic to be implemented includes flow control elements, the implementation of that logic may be inefficient, particularly if the device is programmed using a high-level language.

SUMMARY OF THE INVENTION

One high-level programming language that may be adopted for specifying circuitry of an integrated circuit device, such as for configuring a programmable device, is OpenCL (Open Computing Language), although use of other high-level languages, and particularly other high-level synthesis languages, including C, C++, Fortran, C#, F#, BlueSpec and Matlab, also is within the scope of this invention.

In OpenCL, computation is performed using a combination of a host and kernels, where the host is responsible for input/output (I/O) and setup tasks, and kernels perform computation on independent inputs. Where there is explicit declaration of a kernel, and each set of elements to be processed is known to be independent, each kernel can be implemented as a high-performance hardware circuit. Based on the amount of space available on a programmable device such as an FPGA, the kernel may be replicated to improve performance of an application.

A kernel compiler converts a kernel into a hardware circuit, implementing an application from an OpenCL description, through hardware generation, system integration, and interfacing with a host computer. The compiler may be based on an open-source Low-Level Virtual Machine compiler extended to enable compilation of OpenCL applications. The compiler parses, analyzes, optimizes and implements an OpenCL kernel as a high-performance pipelined circuit, suitable for implementation on programmable device such as an FPGA.

In one variant, that circuit is input to the programming tools appropriate for the particular programmable device, which generates a configuration bitstream to program the device with that circuit. In another variant, the device also has an embedded hard processor or may be configured with an embedded soft processor, to run OpenCL (or other high-level) code, or an external processor may be used. The OpenCL or other high-level code can be run by executing the host program on the embedded or external processor. The system may then be compiled in conjunction with the aforementioned programming tools so that, when executed on the embedded or external processor, it instantiates the circuit equivalent of the kernel.

As disclosed herein, conditional flow control branches in the logic to be implemented in the circuit are converted into predicated instructions. The predicated instructions may be optimized to enhance the reduction of the resulting hardware size and latency, and to increase throughput.

In accordance with the present invention there is provided a method of programming or configuring an integrated circuit device using a high-level language. The method includes parsing a logic flow to be embodied in the integrated circuit device to identify branching control flow, converting the branching control flow into predicated instructions, incorporating the predicated instructions into a high-level language representation of a configuration of resources of the integrated circuit device, and compiling the high-level language representation to configure said integrated circuit device.

A machine-readable data storage medium encoded with instructions to perform the method also is provided, as is a programmable device configured according to the method.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which:

FIG. 7 is a cross-sectional view of a magnetic data storage medium encoded with a set of machine-executable instructions for performing the method according to the present invention;

FIG. 8 is a cross-sectional view of an optically readable data storage medium encoded with a set of machine executable instructions for performing the method according to the present invention.

DETAILED DESCRIPTION OF THE INVENTION

In OpenCL, an application is executed in two parts—a host and a kernel. The host is a program responsible for processing I/O requests and setting up data for parallel processing. When the host is ready to process data, it can launch a set of threads on a kernel, which represents a unit of computation to be performed by each thread.

Each thread executes a kernel computation by loading data from memory as specified by the host, processing those data, and then storing the results back in memory to be read by the user, or by the user's application. In OpenCL terminology, a kernel and the data on which it is executing are considered a thread. Results may be computed for a group of threads at one time. Threads may be grouped into workgroups, which allow data to be shared between the threads in a workgroup. Normally, no constraints are placed on the order of execution of threads in a workgroup.

For the purposes of data storage and processing, each kernel may have access to more than one type of memory—e.g., global memory shared by all threads, local memory shared by threads in the same workgroup, and private memory used only by a single thread.

Execution of an OpenCL application may occur partially in the host program and partially by executing one or more kernels. For example, in vector addition, the data arrays representing the vectors may be set up using the host program, while the actual addition may be performed using one or more kernels. The communication between these two parts of the application may facilitated by a set of OpenCL functions in the host program. These functions define an interface between the host and the kernel, allowing the host program to control what data is processed and when that processing begins, and to detect when the processing has been completed.

A programmable device such as an FPGA may be programmed using a high-level language such as OpenCL by starting with a set of kernels and a host program. The kernels are compiled into hardware circuit representations using a Low-Level Virtual Machine (LLVM) compiler that may be extended for this purpose. The compilation process begins with a high-level parser, such as a C-language parser, which produces an intermediate representation for each kernel. The intermediate representation may be in the form of instructions and dependencies between them. This representation may then be optimized to a target programmable device.

Figure 1:
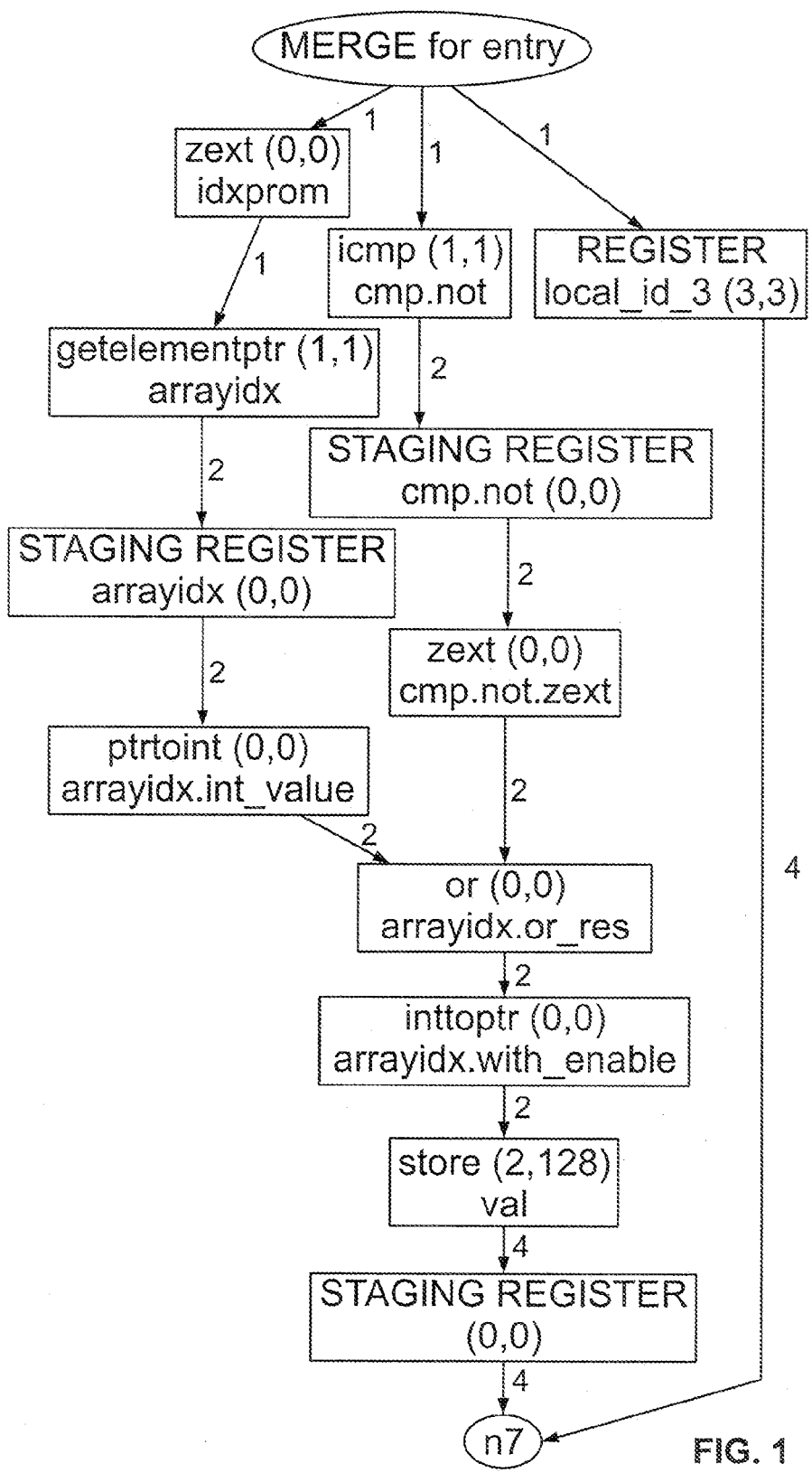
FIG. 1 shows a control-data flow graph used in methods including methods according to embodiments of the invention.

An optimized LLVM intermediate representation is then converted into a hardware-oriented data structure, such as a Control-Data Flow Graph (CDFG) (FIG. 1). This data structure represents the kernel at a low level, and contains information about its area and maximum clock frequency. The CDFG can then be optimized to improve area and performance of the system, prior to RTL generation which produces a Verilog HDL description of each kernel.

The compiled kernels are then instantiated in a system that preferably contains an interface to the host as well as a memory interface. The host interface allows the host program to access each kernel. This permits setting workspace parameters and kernel arguments remotely. The memory serves as global memory space for an OpenCL kernel. This memory can be accessed via the host interface, allowing the host program to set data for kernels to process and retrieve computation results. Finally, the host program may be compiled using a regular compiler for the high-level language in which it is written (e.g., C++).

To compile kernels into a hardware circuit, each kernel is implemented from basic block modules. Each basic block module comprises an input and an output interface with which it talks to other basic blocks, and implements an instruction such as load, add, subtract, store, etc.

The next step in implementing each kernel as a hardware circuit is to convert each basic block module into a hardware module. Each basic block module is responsible for handling the operations inside of it. To function properly, a basic block module also should to be able to exchange information with other basic blocks. Determining what data each basic block requires and produces may be accomplished using Live-Variable Analysis.

Once each basic block is analyzed, a Control-Data Flow Graph (CDFG) (FIG. 1) can be created to represent the operation of that basic block module, showing how that basic block module takes inputs either from kernel arguments or another basic block, based on the results of the Live-Variable Analysis. Each basic block, once instantiated, processes the data according to the instructions contained within the block and produces output that can be read by other basic blocks, or directly by a user.

Once each basic block module has been represented as a CDFG, operations inside the block can be scheduled. Each node may be allocated a set of registers and clock cycles that it requires to complete an operation. For example, an AND operation may require no registers, but a floating-point addition may require at least seven clock cycles and corresponding registers. Once each basic block is scheduled, pipelining registers may be inserted to balance the latency of each path through the CDFG. This allows many threads to be processed.

Once each kernel has been described as a hardware circuit, a design may be created including the kernels as well as memories and an interface to the host platform. To prevent pipeline overload, the number of threads allowed in a workgroup, and the number of workgroups allowed simultaneously in a kernel, may be limited.

Embodiments of the invention may be described with reference to FIGS. 2-6.

Figure 2:
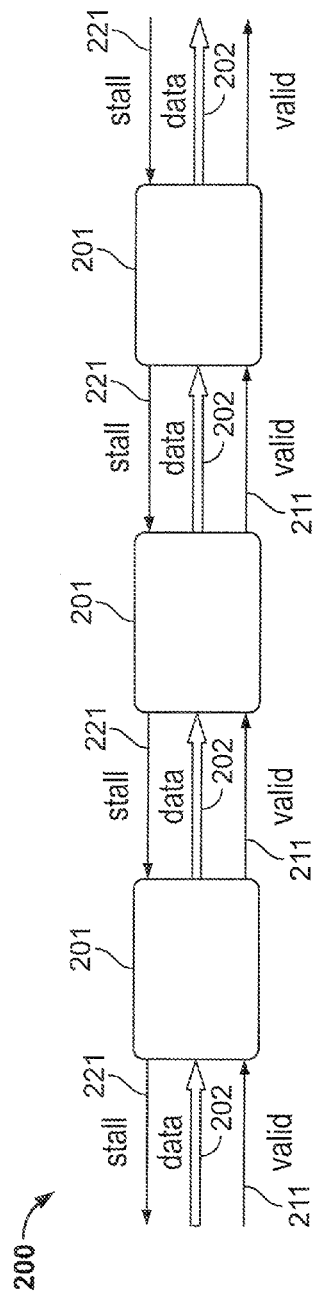
FIG. 2 shows an example of a feed-forward logic pipeline.

FIG. 2 shows a feed-forward pipeline 200 with three blocks 201. Each block 201 could be a load-store unit (i.e., an instruction, or the corresponding hardware implementation of that instruction, that reads or writes a single value from or to a specified address in memory) or a basic computation unit (e.g., addition or multiplication). Data flow from the entry of the pipeline to the exit without diverging or repeating. Thus, each datum is processed once by each block 201 of pipeline 200. Different blocks 201 of pipeline 200 may take different amounts of time to process the data.

To avoid bottlenecks, pipeline 200 may be implemented as a stall signal network, in which each block 201 has a "valid" signal 211 input from the preceding block 201—indicating that the preceding block 201 has completed its computations, and that the data 202 input to the current block 201 are therefore ready to be processed, and a "stall" signal 221 output to the preceding block 201—indicating to preceding block 101 that current block 201 is busy and cannot accept any data. The valid/stall signals 211, 221 allow pipeline 200 to take as much data as it can process and no more.

Consider, however, the following logic:
N=j*j
if (N>3)
   res=N*2
   out[i]=res
else
   res=sin(N)
   out[i]=0
   out[i+1]=res
endif Depending on how N compares to 3, a different value of res will be calculated and stored in a different location.

Figure 3:
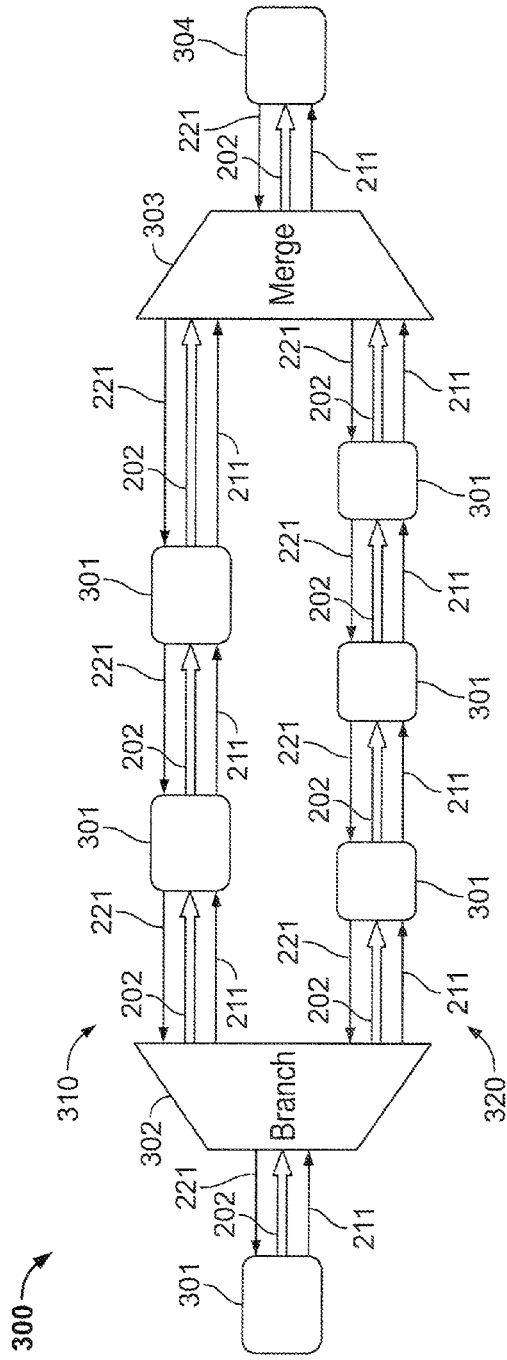
FIG. 3 shows an example of a branched logic pipeline with flow control.

FIG. 3 shows how pipeline 200 may be modified to support the control flow described by the if-statements in the logic described in the previous paragraph. In modified pipeline 300, the first block 301 performs the N=j×j computation, and feeds the result to branch node 302, which selects one of paths 310, 320, depending on the value of N. One of the blocks 301 in path 310 may, e.g., be a multiplier to compute N×2, while one of blocks 301 in path 320 may, e.g., be a DSP block to compute sin(N). The two paths 310, 320, each of which is similar to path 200, merge at merge node 303, which gathers multiple data, valid, and stall signals to be presented to node 304.

The branch and merge nodes 302, 303 are undesirable because they consume relatively large amounts of hardware area. In addition, the computation flows through either path 310 or path 320, but never through both paths, so one path is always idle. Moreover, if there are blocks in both paths that perform essentially the same function, then because the two copies of the block will never be used at the same time (because one path is always idle), replication of that block in both paths is a further waste of hardware area.

If the logic described above is implemented instead replacing each flow control condition with a predicated instruction—i.e., an instruction that does not do anything if its predicate (a Boolean argument) is false—then the logic may look like this:
N=j*j
cond=(N>3)
res1=N*2
res2=sin(N)
value=if (cond) res1, else 0
out[i]=value
out[i+1]=res2 if not cond Such logic can be implemented in a feed-forward path such as path 200, and achieves the same result as (i.e., the same values in the out [ ] array), but without the explicit control flow branches of, the previous logic.

The variable res1 is output only if the condition is met, while the variable res2 is output only if the condition is not met. Nevertheless, both res1 and res2 are always calculated, even though only one of them will be needed. There is no harm in letting an element execute even if its controlling condition is false, as long as the execution or its effects are not observable outside the circuit. The savings in area and execution speed resulting from elimination of the flow control nodes more than makes up for the resources consumed by executing the unused elements.

In addition, the feed-forward logic has only two load-store units (i.e., assignments to the output array out [ ]), whereas the branching logic has three load-store units. Load-store units are relatively large, so reducing their number is advantageous. The reduction in the number of load-store units is an example of instruction sharing.

An instruction that appears in two mutually exclusive branches can be shared by both branches. In the example above, the load-store unit out[i] is shared by selecting the value being stored based on the condition cond. The sharing is worth doing if the size of the selection instruction is smaller than the size of the instruction considered for sharing, which is almost always the case.

The more complicated the instruction is, and the greater the number of branches among which the instruction can be shared, the more worthwhile instruction sharing will be. The example below, which shows sharing of an instruction among three branches, also shows how to convert branches to conditions for predicated instructions.

Consider the following logic:
if (a)
  if(b and c)
    X
  else if (b)
    Y
  endif
else
  V
endif
Z
if (c)
  if (b and not a)
    W
  endif
endif in which each block of logic V, W, X, Y, Z includes a load-store unit. Translating the if-else flow control statements, the predicates for each block are:
Block X: a and b and c
Block Y: a and b and not c
Block V: not a
Block Z: true
Block W: b and c and not a Therefore, all the branches in the code above can be removed and the code re-written in predicated form as follows:
X if (a & b & c)
Y if (a & b & !c)
V if (!a)
Z if (true)
W if (!a & b & c)

The next step is to push the predication down from the blocks to the individual instructions within each block. For most instructions, the predicate can be ignored (because, as noted above, if unnecessary execution of the instruction has no effect on the outside world, it can be allowed to proceed). Instructions for which the predicate cannot be ignored are:

1. Any instruction whose effect is observable to the outside world (such as a load-store unit). Such instructions should be predicated.
2. Any instruction whose implementation requires a large area. Maintaining a predicate on such an instruction may allow instruction sharing if two or more uses of the instruction exist with mutually exclusive predicates.

The size of a hardware implementation can be decreased if the predicate conditions can be simplified. For example, assume in the most recent example above that logic blocks X, Y, and V all contain the same load-storage unit. Those three load-storage units can be merged into a single load-storage unit that will be active if block X is active OR block Y is active OR block V is active. Combining the predicates for X, Y and V yields:

(a & b & c)|(a & b & !c)|(!a)

This can be simplified further to:

!a|b which minimizes the hardware even further.

One way to simplify Boolean equations is use Binary Decision Diagrams (BDDs). Each predicate (which is a Boolean expression) can be expressed as a BDD, and then standard BDD transformations may be applied to the BDD. Finally, the BDD may be converted back to a Boolean expression.

If the high-level code does not have any loops, the branch removal techniques described above will remove all branches. That technique will also remove branches inside a single loop, if the loop has one entry and one exit point. However, if the high-level code has branches that go from inside to outside of a loop, as shown in FIG. 4, that technique would not be effective to remove those branches.

Figure 4:
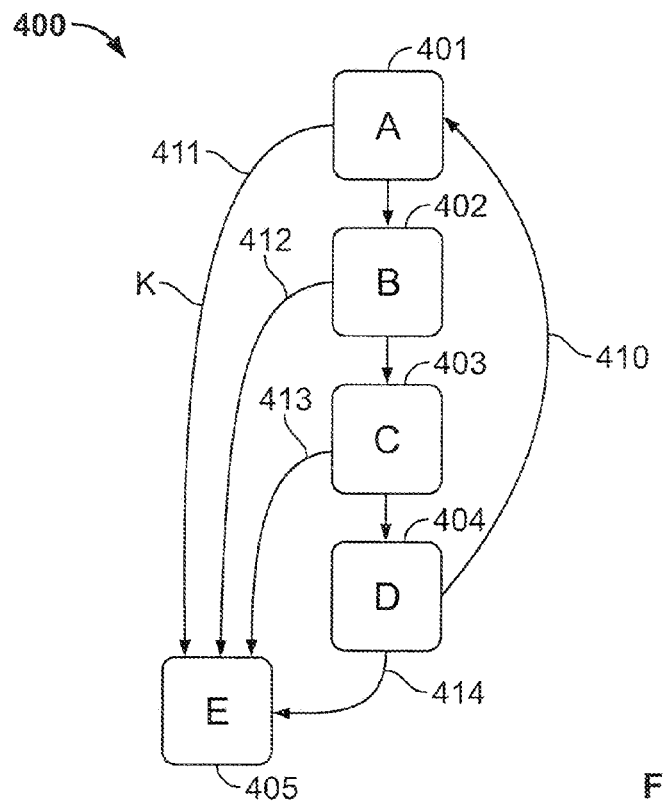
FIG. 4 shows an example of a logic flow including loops.

In logic 400 of FIG. 4, blocks A (401), B (402), C (403) and D (404) form a loop 410. However, each of blocks A (401), B (402), C (403) includes a respective condition 411, 412, 413 to allow early exit from loop 410 (i.e., exit without going through block D (404)) to block E (405). Block D (404) also contains an exit condition 414 that causes exit to block E (405).

Figure 5:
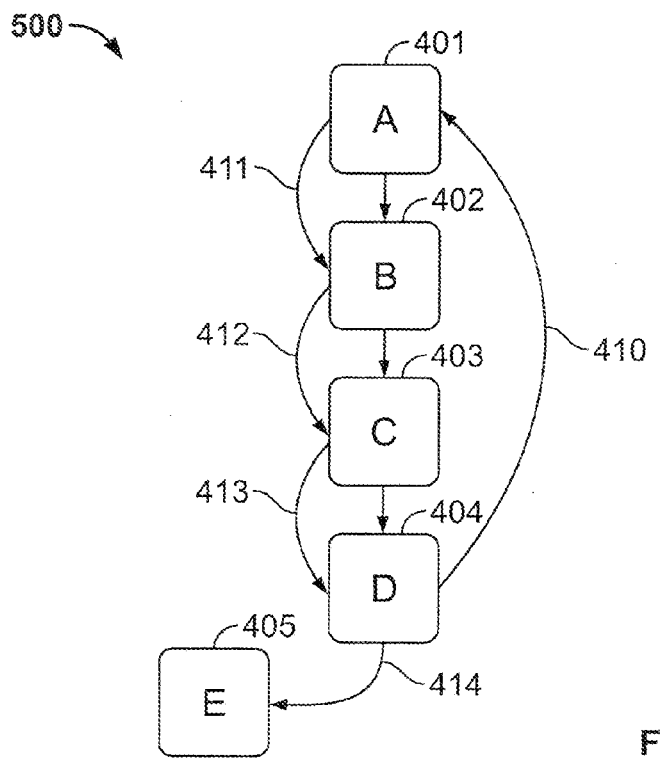
FIG. 5 shows how the logic flow of FIG. 4 may be redefined to work with embodiments of the invention.
Figure 6:
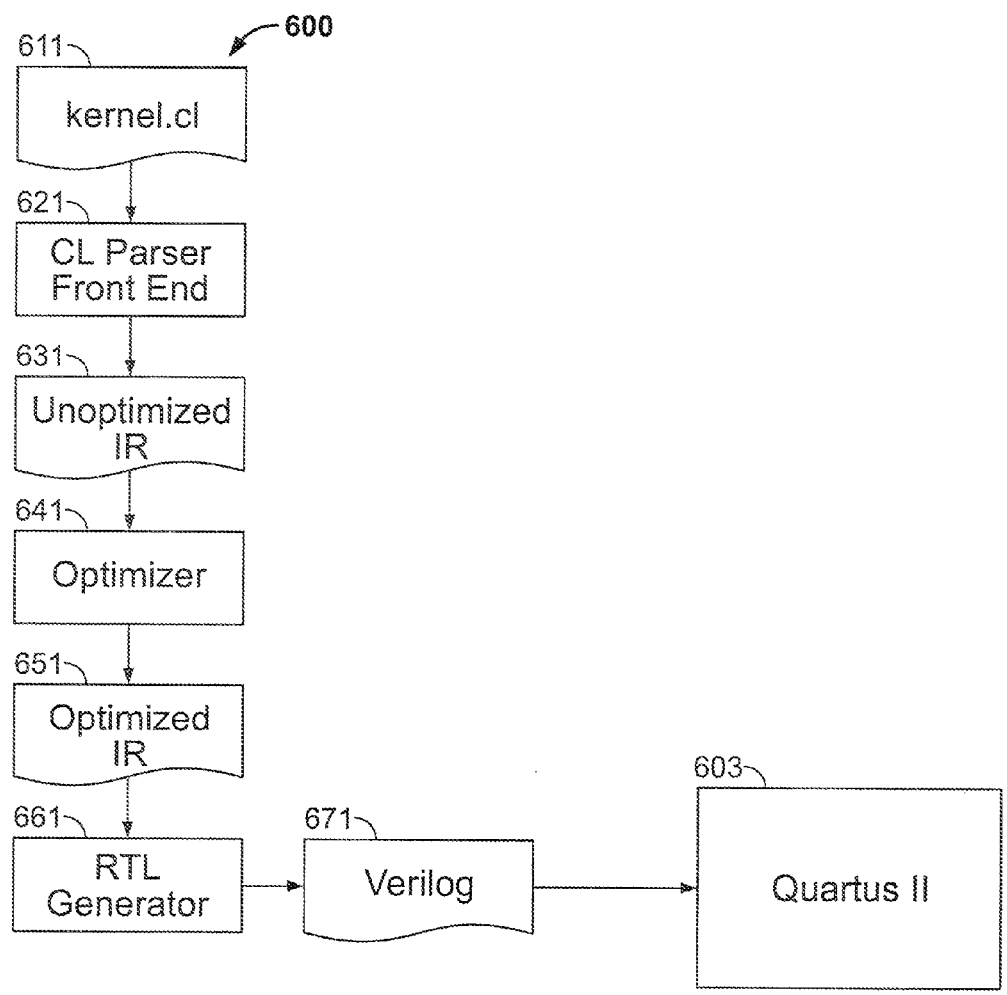
FIG. 6 shows a method, which may be used with embodiments of the invention, for using a high-level language to configure a programmable device.

To use the technique above to remove branches from logic 400, logic 400 first may be converted to logic 500 of FIG. 5, in which the flow from each of blocks A (401), B (402) and C (403) is always to the respective next block B (402), C (403) and D (404). Such control flow conversion can be achieved by using the respective early exit condition 411/412/413 as the predicate for instructions in the following block B (402), C (403) and D (404). For example, say control flow from block A (401) goes to block E (405) (early exit condition 411), if condition K is true. Instead, block A (401) can be controlled to flow to block B (402), then block C (403) then block D (404) at all times, but the instructions in all following blocks B (402), C (403) and D (404) are predicated to execute only if condition K is false, and block D (404) also contains an instruction to go to block E (405) if condition K is true. Additional similar predicate conditions can be included in the instructions of blocks C (403) and D (404) relative to the exit conditions 412/413 of blocks B (402) and C (403). Indeed, once such a control structure has been established, blocks A (401) through D (404) can be collapsed down into a single block (not shown) looping back on itself or exiting to block E (405). Thus, use of predicated instructions simplifies loops in the code to a loop in a single basic block.

Once the predicated code has been derived, and simplified to the extent desired, known techniques can be used to configure a programmable device. For example, the code can be incorporated in an OpenCL kernel which is converted in method 600, diagrammed in FIG. 6, into a configuration bitstream for a programmable device.

Method 600 starts with a kernel file (kernel.cl) 611. Parser front end 621 derives unoptimized intermediate representation 631 from kernel file 611, which is converted by optimizer 641 to an optimized intermediate representation 651. The optimization process includes compiler techniques to make the code more efficient, such as, e.g., loop unrolling, memory-to-register conversion, dead code elimination, etc. A Register Timing Language (RTL) 661 generator converts optimized intermediate representation 651 into a hardware description language representation 671, which may be written in any hardware description language such as Verilog (shown) or VHDL.

Hardware description language representation(s) 671 of the kernel(s) are compiled into a programmable device configuration by appropriate software 603. For example, for FPGA devices available from Altera Corporation, of San Jose, Calif., software 603 might be the QUARTUS® II software provided by Altera.

Although some or all of the various functions in method 600 may be executed by special-purpose hardware circuits dedicated to those functions, most or all of those functions would more commonly be performed by a processor. As previously noted, the device being configured could be a fixed-logic device or a programmable device. In the case of fixed-logic device, the processor would necessarily be external to the device, as the device will not yet have been formed. In the case of a programmable device, as previously noted, the processor could be external to the device being configured, or could be embedded in the device, and if the processor is embedded, it could be a "hard" processor or a "soft" processor. If the embedded processor is a "soft" processor, it also may be configured using software 603. If the embedded processor is a "hard" processor, software 603 may configure appropriate connections to the hard processor.

Thus it is seen that a method for configuring a fixed or programmable integrated circuit device using a high-level synthesis language, while reducing the resources consumed, particularly on a programmable device, has been provided.

Instructions for carrying out a method according to this invention for configuring an integrated circuit device may be encoded on a non-transitory machine-readable memory medium (e.g., a magnetic disk, a nonvolatile RAM, or an optical disk such as a CD-ROM or DVD-ROM), to be executed by a suitable computer or similar device to implement the method of the invention for programming or configuring PLDs or other devices with a configuration described by a high-level synthesis language as described above. For example, a personal computer may be equipped with an interface to which a PLD can be connected, and the personal computer can be used by a user to program the PLD using suitable software tools as described above.

FIG. 7 presents a cross section of a magnetic data storage medium 1200 which can be encoded with a machine executable program that can be carried out by systems such as the aforementioned personal computer, or other computer or similar device. Medium 1200 can be a floppy diskette or hard disk, or magnetic tape, having a suitable substrate 1201, which may be conventional, and a suitable coating 1202, which may be conventional, on one or both sides, containing magnetic domains (not visible) whose polarity or orientation can be altered magnetically. Except in the case where it is magnetic tape, medium 1200 may also have an opening (not shown) for receiving the spindle of a disk drive or other data storage device.

The magnetic domains of coating 1202 of medium 1200 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

FIG. 8 shows a cross section of an optically-readable data storage medium 1210 which also can be encoded with such a machine-executable program, which can be carried out by systems such as the aforementioned personal computer, or other computer or similar device. Medium 1210 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1210 preferably has a suitable substrate 1211, which may be conventional, and a suitable coating 1212, which may be conventional, usually on one or both sides of substrate 1211.

In the case of a CD-based or DVD-based medium, as is well known, coating 1212 is reflective and is impressed with a plurality of pits 1213, arranged on one or more layers, to encode the machine-executable program. The arrangement of pits is read by reflecting laser light off the surface of coating 1212. A protective coating 1214, which preferably is substantially transparent, is provided on top of coating 1212.

In the case of magneto-optical disk, as is well known, coating 1212 has no pits 1213, but has a plurality of magnetic domains whose polarity or orientation can be changed magnetically when heated above a certain temperature, as by a laser (not shown). The orientation of the domains can be read by measuring the polarization of laser light reflected from coating 1212. The arrangement of the domains encodes the program as described above.

Figure 9:
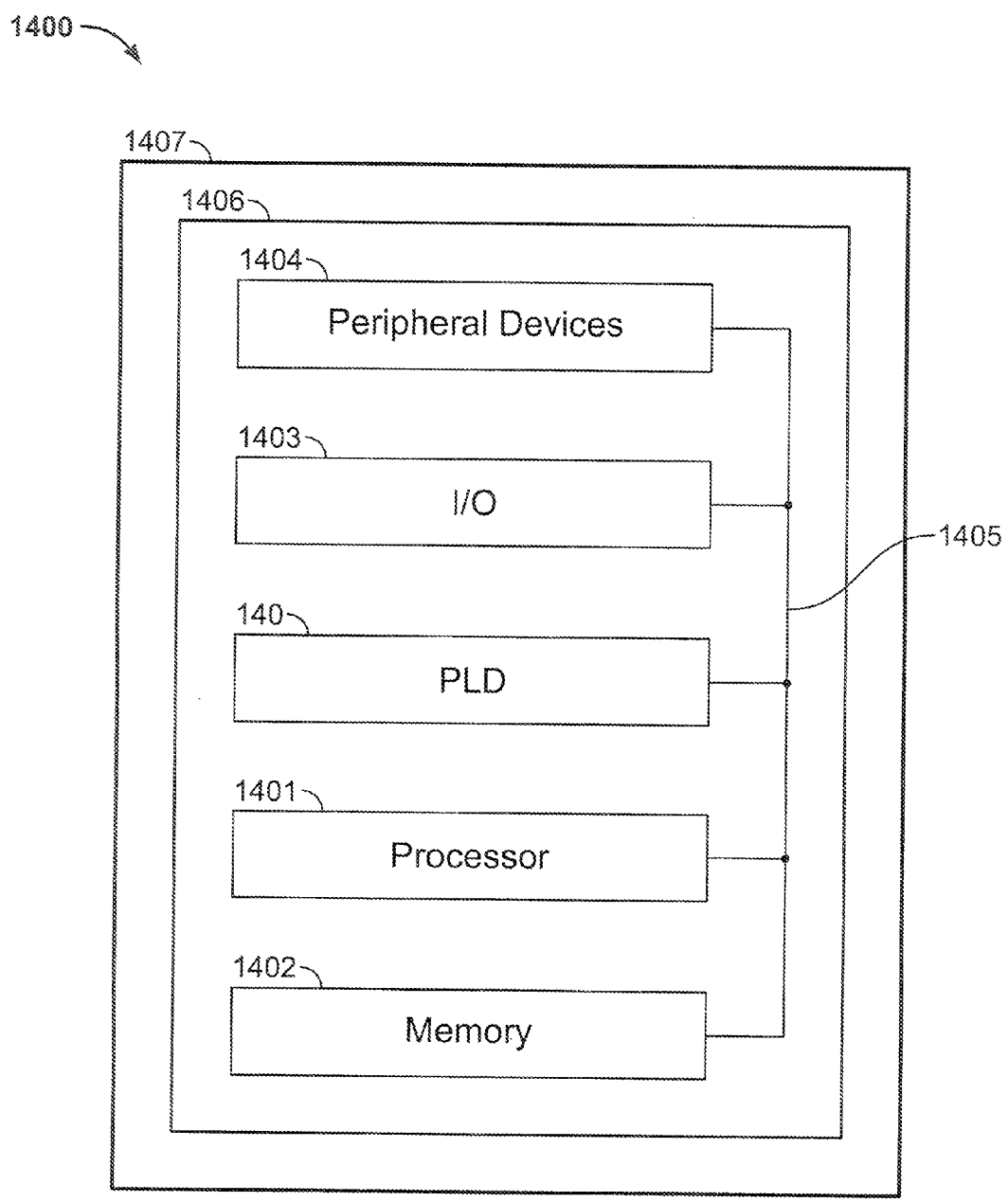
FIG. 9 is a simplified block diagram of an illustrative system employing a programmable logic device incorporating the present invention.

A PLD 140 programmed according to the present invention may be used in many kinds of electronic devices. One possible use is in a data processing system 1400 shown in FIG. 9. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

System 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to a shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of configuring an integrated circuit device using a high-level language, said method comprising:
   using a software tool on a processor, parsing a logic flow, to be embodied as circuitry in said integrated circuit device, to identify branching control flow;
   using said software tool on a processor, converting said branching control flow into predicated instructions, including combining predicates of different branches that share executable elements;
   using said software tool on a processor, incorporating said predicated instructions into a high-level language representation of a configuration of hardware resources of said integrated circuit device as said circuitry; and
   using said software tool on a processor, compiling said high-level language representation to configure said hardware resources of said integrated circuit device as said circuitry.

2. The method of claim 1 wherein said high-level language is OpenCL.

3. The method of claim 2 wherein said logic flow is represented as an OpenCL kernel.

4. The method of claim 1 wherein said integrated circuit device is a programmable integrated circuit device and said compiling comprises deriving, from said high-level language representation, a configuration bitstream that configures said programmable integrated circuit device as said circuitry.

5. The method of claim 4 wherein at least one of said parsing, said converting, said incorporating, and said compiling are performed by a processor embedded in said programmable integrated circuit device.

6. The method of claim 1 wherein:
   said parsing a logic flow to be programmed into said programmable integrated circuit device further comprises using a software tool on a processor to parse said logic flow to identify loops; and
   said converting further comprises using a software tool on a processor to simplify said loops using predicated instructions.

7. The method of claim 6 wherein simplifying said loops using predicated instructions comprises using a software tool on a processor to convert a loop exit condition into a predicate for instructions subsequent to occurrence of said exit condition.

8. A non-transitory machine readable storage medium encoded with instructions for performing a method of configuring an integrated circuit device using a high-level language, said instructions comprising:
   instructions to parse a logic flow, to be embodied as circuitry in said integrated circuit device, to identify branching control flow;
   instructions to convert said branching control flow into predicated instructions, including instructions to combine predicates of different branches that share executable elements;
   instructions to incorporate said predicated instructions into a high-level language representation of a configuration of hardware resources of said integrated circuit device as said circuitry; and instructions to compile said high-level language representation to configure said hardware resources of said integrated circuit device as said circuitry.

9. The non-transitory machine readable storage medium of claim 8 wherein:
said high-level language is OpenCL; and
said instructions to incorporate said predicated instructions into a high-level language representation comprise instructions to incorporate said predicated instructions into an OpenCL kernel.

10. The non-transitory machine readable storage medium of claim 8 wherein said instructions for performing a method of configuring further comprise instructions to execute said high-level language representation in a processor on said programmable integrated circuit device to instantiate said configuration of said hardware resources as said circuitry.

11. The non-transitory machine readable storage medium of claim 8 wherein said integrated circuit device is a programmable integrated circuit device and said instructions to compile comprise instructions to compile said high-level language representation to generate a configuration bitstream for configuring said hardware resources of said programmable integrated circuit device as said circuitry.

12. The non-transitory machine readable storage medium of claim 8 wherein:
said instructions to parse said logic flow to be embodied as circuitry in said integrated circuit device comprises instructions to parse said logic flow to identify loops; and
said instructions to convert further comprise instructions to simplify said loops using predicated instructions.

13. The non-transitory machine readable storage medium of claim 12 wherein said instructions to simplify said loops using predicated instructions comprise instructions to convert a loop exit condition into a predicate for instructions subsequent to occurrence of said exit condition.

14. A programmable integrated circuit device configured as circuitry using a high-level language, said configured programmable integrated circuit device comprising:
logic structures configured to implement predicated instructions in place of flow control, including logic structures configured to combine predicates of different branches that share executable elements; wherein:
hardware resources of said programmable integrated circuit device are conserved by avoiding implementation of flow control structures in said circuitry.

15. The programmable integrated circuit device of claim 14 wherein said high-level language is OpenCL.

16. The programmable integrated circuit device of claim 15 further comprising:
a processor; wherein:
said logic structures are implemented by said processor as circuitry using a high-level language.

17. The programmable integrated circuit device of claim 16 wherein said high-level language is OpenCL.

18. The programmable integrated circuit device of claim 14 wherein said logic structures are implemented by compiling a high-level language representation to generate a configuration bitstream that configures said hardware resources as said circuitry.

19. The programmable integrated circuit device of claim 14 wherein said logic structures are further configured to implement predicated instructions to simplify loops.

20. The programmable integrated circuit device of claim 19 wherein said logic structures configured to implement predicated instructions to simplify loops are configured to implement a loop exit condition as a predicate for instructions subsequent to occurrence of said exit condition.

\* \* \* \* \*